United States Patent

Miya et al.

Patent Number: 5,927,303
Date of Patent: Jul. 27, 1999

[54] SUBSTRATE PROCESSING APPARATUS

[75] Inventors: Katsuhiko Miya, Shiga; Akira Izumi, Kyoto, both of Japan

[73] Assignee: Dainippon Screen Mfg. Co., Ltd., Japan

[21] Appl. No.: 08/996,075

[22] Filed: Dec. 22, 1997

[30] Foreign Application Priority Data

Jan. 17, 1997 [JP] Japan .................................. 9-006376

[51] Int. Cl.⁶ .................................................. B08B 3/02
[52] U.S. Cl. .......................... 134/148; 134/153; 134/902; 134/200
[58] Field of Search ................................ 134/153, 148, 134/902, 200

[56] References Cited

U.S. PATENT DOCUMENTS

| | | | |
|---|---|---|---|
| 4,790,262 | 12/1988 | Nakayama | 118/52 |
| 4,838,979 | 6/1989 | Nishida | 156/345 |
| 5,156,174 | 10/1992 | Thompson | 134/153 |
| 5,584,310 | 12/1996 | Bergman | 134/95.1 |
| 5,762,708 | 6/1998 | Motoda | 118/52 |
| 5,778,913 | 7/1998 | Degani | 134/153 |
| 5,779,796 | 7/1998 | Tomoeda | 118/319 |

*Primary Examiner*—Frankie L. Stinson
*Assistant Examiner*—Mialeeka C. Williams-Bibbs
*Attorney, Agent, or Firm*—Ostrolenk, Faber, Gerb & Soffen, LLP

[57] ABSTRACT

In a substrate processing apparatus wherein a substrate is held horizontally and rotated about a center axis which extends in a vertical direction to thereby supply processing liquid to the substrate, vertical grooves which are twisted in a direction of rotation of the substrate are formed in a cover surface which is a bottom surface of a cover plate which covers a top surface of the substrate across a gap. Although the processing liquid which is supplied to the substrate is scattered at the substrate and adhere as drops to the cover surface, subjected to force of an air stream which is created as a substrate rotates, the drops move along the grooves on the cover surface. This permits the drops on the cover surface to be smoothly discharged outside the cover surface without allowing the drops to fall off onto the substrate, which in turn improves the quality of the substrate.

13 Claims, 13 Drawing Sheets

A—A

B-B

C-C

SUBSTRATE PROCESSING APPARATUS

BACKGROUND OF THE INVENTION

1. Field of the Invention

The present invention relates to a substrate processing apparatus which processes a substrate by a predetermined treatment which uses processing liquid while rotating the substrate.

2. Description of the Background Art

FIG. 1 is a vertical cross sectional view showing an example of a conventional substrate processing apparatus 101. In the substrate processing apparatus 101, a substrate W is held by a rotation stage 121 in a horizontal direction and rotated about a center axis Z, which is in a vertical direction, through a rotation shaft 122 which is connected to the rotation stage 121. In addition, to a surface of the substrate W which is rotated, processing solution, pure water, nitrogen gas and the like are supplied through a processing solution supply pipe 141 and a gas supply pipe 142.

Further, in such a substrate processing apparatus, a cover plate 131 is disposed in a faced relationship with the substrate W in order to isolate the substrate W from an external atmosphere, and the rotation stage 121 is enclosed on side by a cup 151.

Such a structure described above allows processing solution to be dropped down from the processing solution supply pipe 141, aiming at removing an oxide film or the like from the surface of the substrate W, during or immediately prior to rotation of the substrate W achieved by the rotation stage 121. Following this, pure water is supplied while rotating the substrate W so that the substrate W is cleaned, and nitrogen gas is then blown toward the substrate W from the gas supply pipe 142 so as to dry the substrate W.

FIG. 2 is a diagram of a bottom surface 131a of the cover plate 131 (hereinafter referred to "cover surface"), viewed from below, which is faced with a top surface of the substrate W. At the cover surface 131a of the cover plate 131, as the substrate W rotates in the direction or an arrow Rot, an air stream is created as indicated by arrows AR1. The air stream flows toward the center axis Z like a vortex, bearing off toward the center axis Z which is the center of rotation of the substrate W from a circumferential direction. Arrows AD indicate the directions and the strengths of the air stream at different positions. In FIG. 1, a general presentation of the air stream at the vertical cross section is given as arrows AR2.

Since the air stream flowing toward the center is created at the cover surface 131a in this manner, among drops of chemical liquid or pure water which are spattered off the substrate W after dropped on the surface of the substrate W, drops DR adhering to the cover surface 131a move toward the center as shown in FIG. 1. However, while moving toward the center, the drops DR merge into larger drops and eventually fall off onto the surface of the substrate W because of gravity. As a result, dusts and contaminants which are contained in the drops DR adhere to the substrate W, which leads to an uneven treatment of the substrate W and degrades the quality of the substrate W.

SUMMARY OF THE INVENTION

The present invention is directed to an apparatus for processing a substrate, comprising: a) support means for supporting the substrate horizontally; b) rotation means for rotating the support means around a vertical center axis of the substrate; c) cover means for covering an upper surface of the substrate across a gap, comprising: c-1) a cover surface opposite to the upper surface of the substrate, and c-2) a radial uneven pattern provided on the cover surface and twisted in a direction of rotation of the substrate; and d) liquid supply means for supplying processing liquid on the upper surface of the substrate.

Therefore, even if processing liquid which is supplied to the substrate is scattered and adhere as drops to the cover surface, it is possible to discharge the drop outside the cover surface, utilizing an air stream which is created on the cover surface. This prevents the drop on the cover surface from falling off onto the substrate, and improves the quality of the substrate.

Preferably, the support means comprises a-1) pins for chucking the substrate, and the cover means further comprises c-3) an annular recess defining a clearance for accepting the pins.

Since this reduces the gap between the substrate and the cover surface, it is possible to reduce the number of particles and the like which intrude above the substrate, and improve the quality of the substrate.

Preferably, the radial uneven pattern extends to the annular recess.

Further, preferably, the cover means further comprises c-4) a gutter extending from the annular recess toward an edge of the cover surface and inclined to the direction of rotation of the substrate.

Therefore, it is possible to smoothly discharge drops which are collected in the gutter.

Accordingly, an object of the present invention is to provide a substrate processing apparatus which prevents a drop which contaminates a substrate from falling off onto the substrate and accordingly improves the quality of the substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

<1. First Preferred Embodiment>

Figure 3:
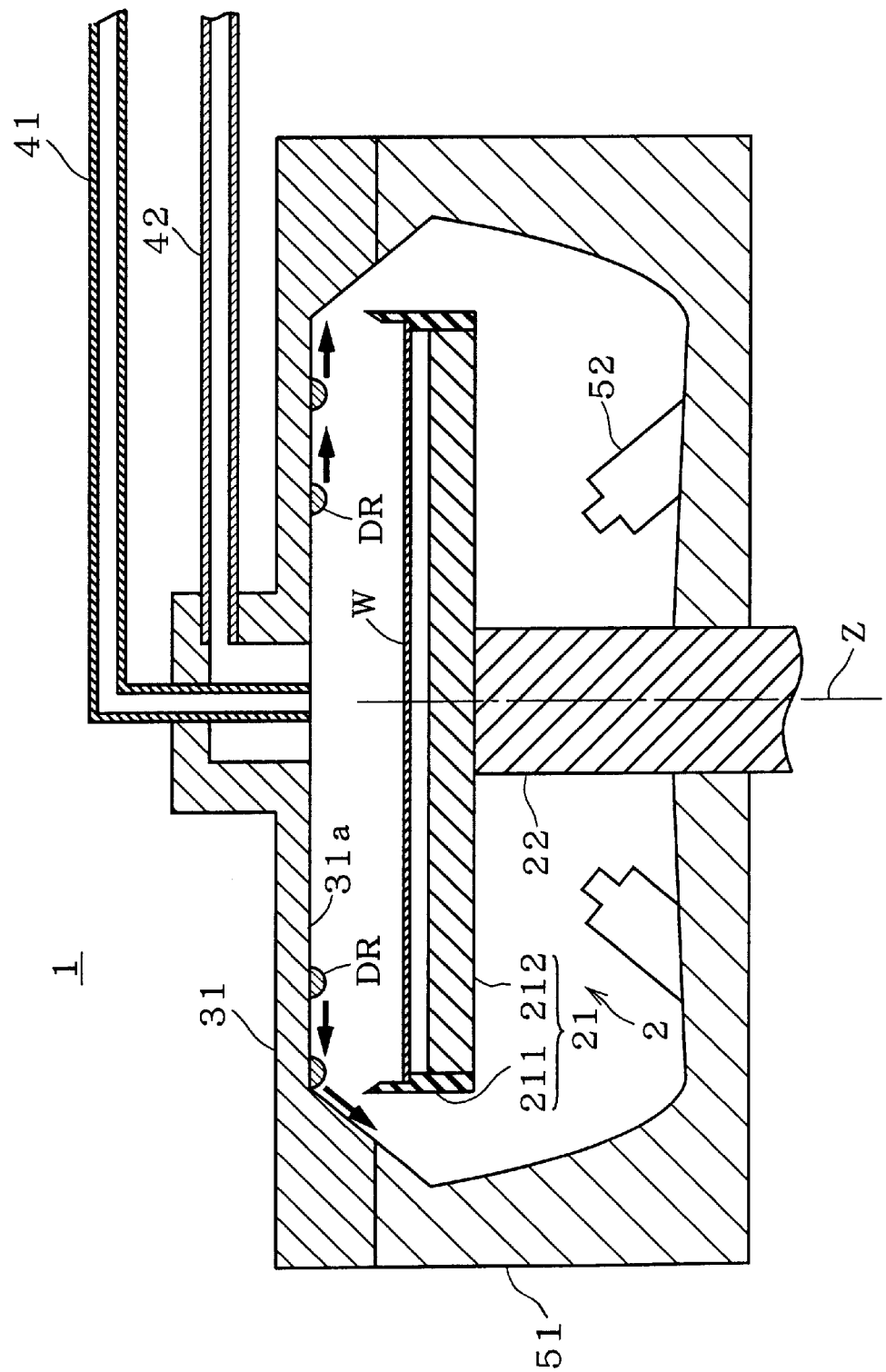
FIG. 3 is a vertical cross sectional view of a substrate processing apparatus according to a first preferred embodiment of the present invention.

FIG. 3 is a vertical cross sectional view of a substrate processing apparatus 1 according to a first preferred embodiment of the present invention. The substrate processing apparatus 1 is an apparatus in which processing solution is dropped onto a substrate W to thereby process a surface of the substrate W by a predetermined treatment while rotating the substrate W (or immediately before rotating the substrate W), pure water is dropped onto the substrate W to thereby clean the substrate W, and nitrogen gas or the like is supplied to the substrate W to thereby dry the substrate W.

The substrate processing apparatus 1 comprises a rotation part 2 which supports substrate W and rotates, a cover plate 31 to which a processing solution supply pipe 41 and a gas supply pipe 42 are connected, and a cup 51 which together with the cover plate 31 defines a space in which the rotation part 2 is disposed.

The rotation part 2 comprises a rotation stage 21 which supports the substrate W in a horizontal direction, and a rotation shaft 22 which is connected to the rotation stage 21. As the rotation shaft 22 rotated about a center axis Z, which extends in a vertical direction and around which the substrate rotates, by a drive source not shown, the substrate W on the rotation stage 21 rotates. Further, the rotation stage 21 supports the substrate W from below, and comprises a chuck pin 211 which restricts the position of the substrate in the horizontal direction. The chuck pin 211 is fixed to the rotation shaft 22 through a chuck support member 212.

The cover plate 31 is disposed on a top surface of the substrate W (rotation plate 21) across a gap, so as to cover the top surface of the substrate W. The processing solution supply pipe 41 and the gas supply pipe 42 are connected to the center of the cover plate 31. This ensures that processing liquid, such as processing solution or pure water, which is dropped through the processing solution supply pipe 41 hits the substrates W approximately at the center and that gas such as nitrogen gas from the gas supply pipe 42 is supplied toward the substrate W.

The cup 51 is so shaped to have an opening at the top and enclose the rotation stage 21 from side and below. The cover plate 31 is disposed in such a manner to close the opening, whereby a processing space is created. Hence, even if processing liquid dropped onto the substrate W is spattered around as the substrate W rotates, the processing liquid adhere to an inner surface of the cup 51 and collected by the cup 51. The inner surface of the cup 51 is connected continuously to a cover surface, as shown in FIG. 3.

Disposed on the bottom of the cup 51 is a nozzle 52 for supplying processing solution or pure water toward a back surface of the substrate W. Through an opening (not shown) which is formed in the chuck support member 212, processing solution or pure water are supplied to the back surface of the substrate W.

Figure 4:
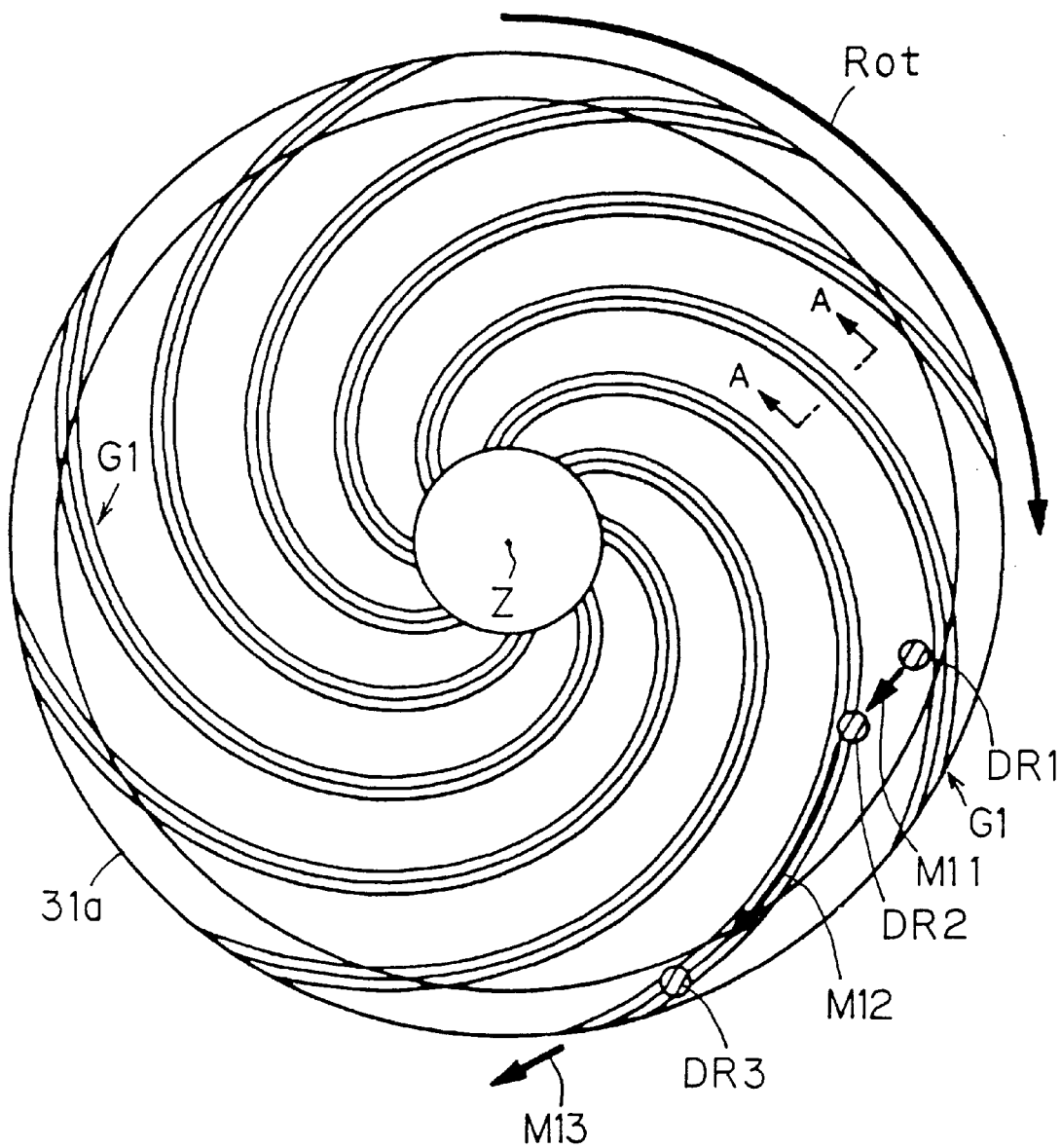
FIG. 4 is a diagram showing a cover surface of a cover plate.
Figure 5:
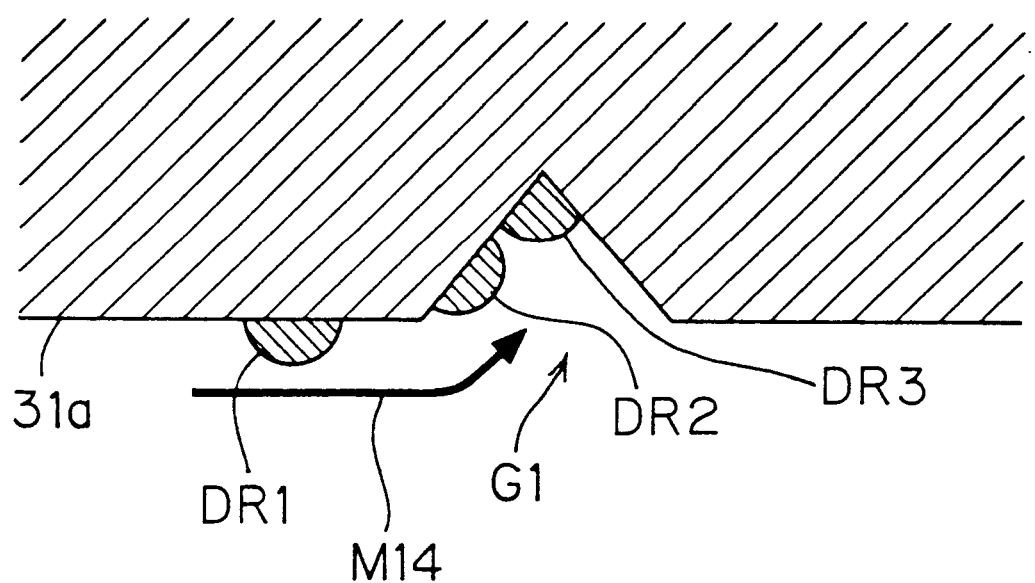
FIG. 5 is a cross sectional view of grooves which are formed in the cover surface.

FIG. 4 is a diagram of a cover surface 31a of the cover plate 31 of the substrate processing apparatus 1, which is a bottom surface of the cover plate 31, as it is viewed from below. The cover surface 31a is formed by a circular planar surface which is in an opposed relationship with a top surface of the substrate W, and a slanted surface surrounding the circular planar surface, as shown in FIG. 3. A plurality of grooves G1 are formed vertically and radially in the cover surface 31a. The grooves G1 are twisted in a rotation direction Rot of the substrate W. FIG. 5 is a cross sectional view taken along an arrow A—A, showing one of the grooves G1 which is V-shaped.

Figure 1:
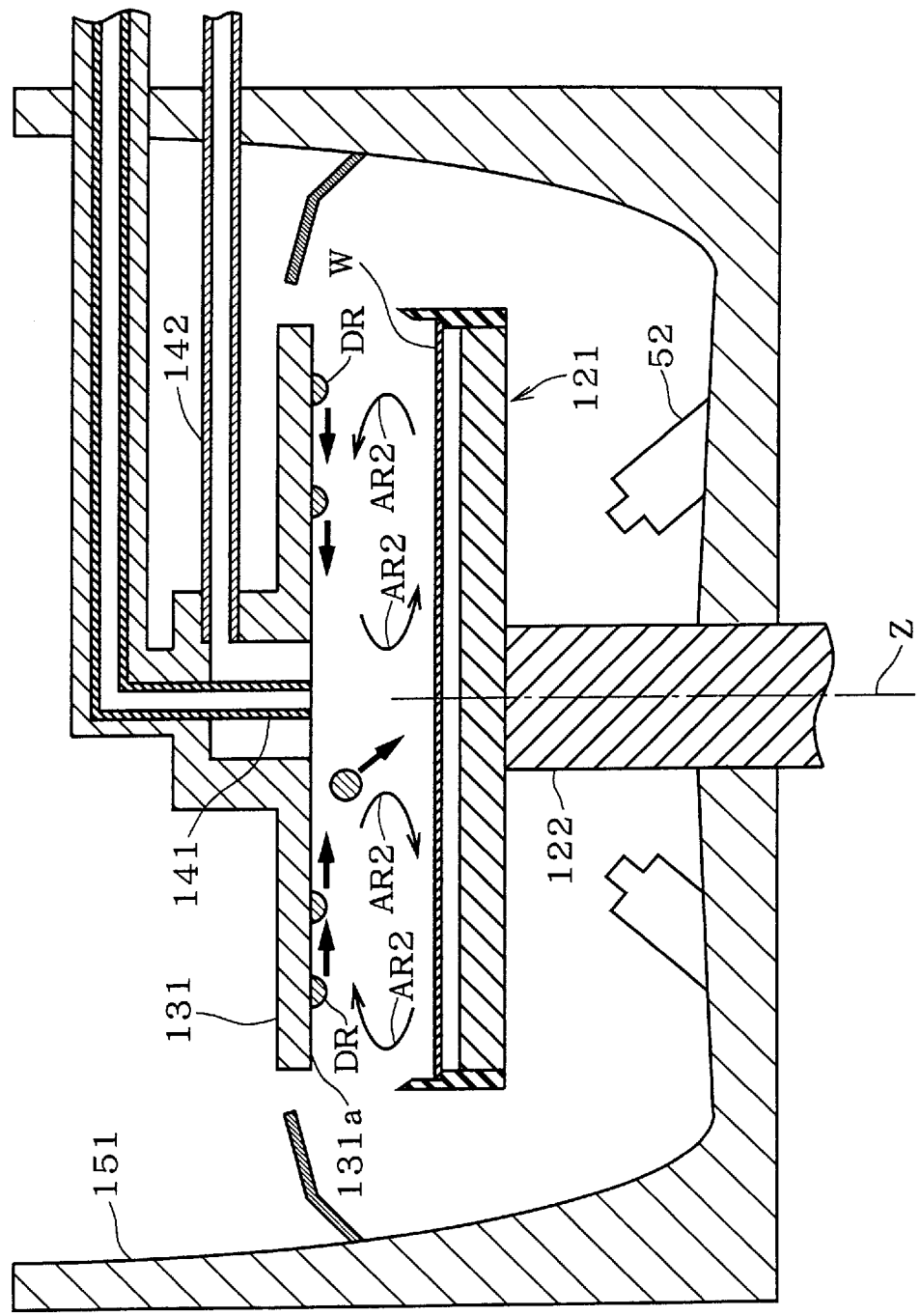
FIG. 1 is a vertical cross sectional view showing an example of a conventional substrate processing apparatus.
Figure 2:
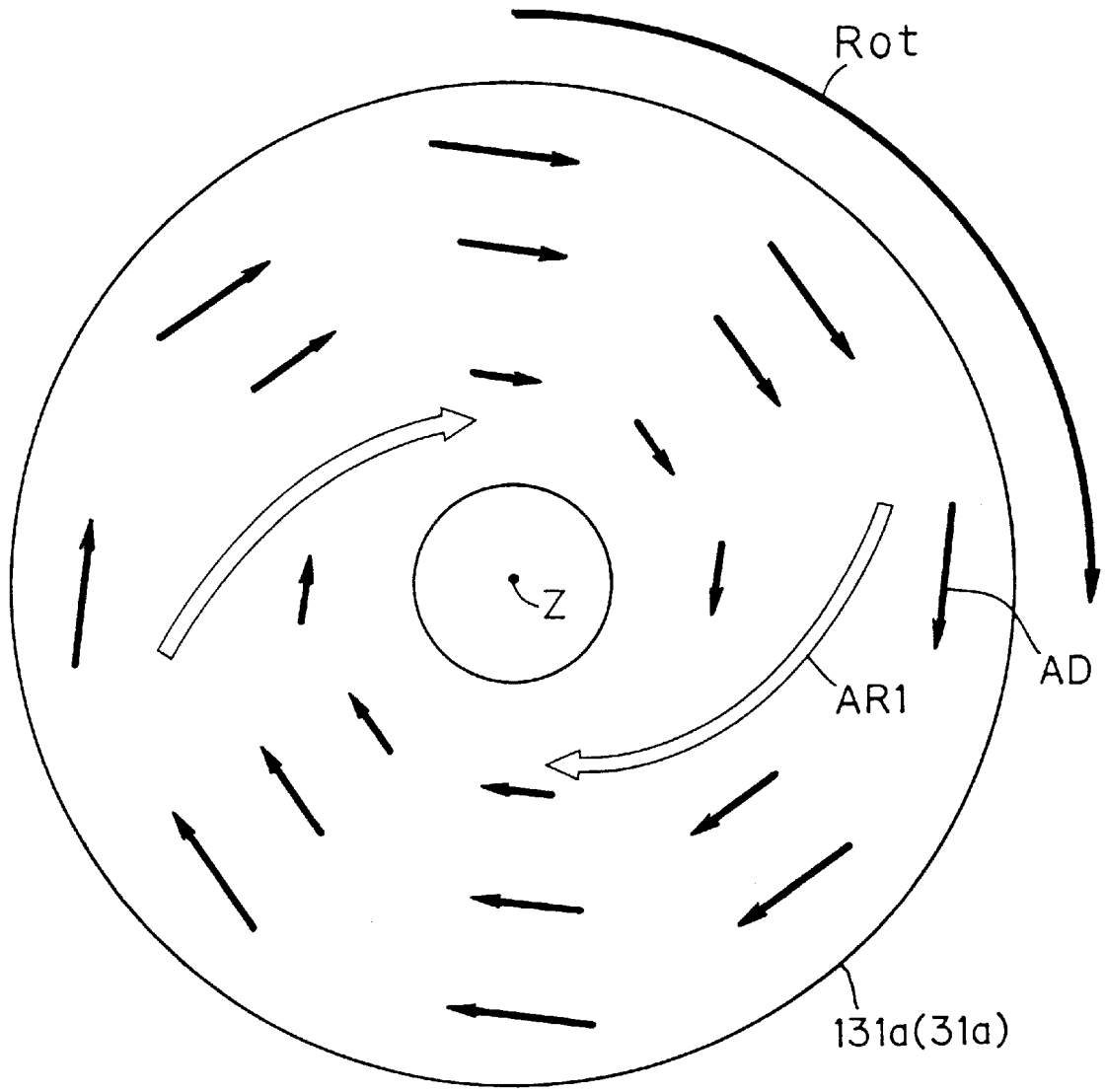
FIG. 2 is a diagram a condition of an air stream at a bottom surface of a cover plate.

At the cover surface 31a, as the substrate W rotates, a swirling air stream is created toward the center as indicated by arrows AR1, as described in relation to FIG. 2. Hence, drops DR scattered off the substrate W and adhered to the cover surface 31a are moved along the air stream. However, since the grooves G1 are formed in the cover surface 31a, the drops DR move along the grooves G1, which will be described with reference to FIGS. 4 to 6. As described in the following, in accordance with the movement of the drops DR, the drops DR will be referred to as "DR1," "DR2," etc.

As shown in FIG. 4, a drop DR1 adhered to the cover surface 31a moves as indicated by an arrow M11, along the air stream at the cover surface 31a, that is, the drop DR1 moves somewhat toward the center axis Z from a circumferential direction. As time elapses, a drop DR2 arrives at the groove G1 and reaches the deepest position in the groove G1, which is shown in FIG. 5 as it is viewed from an A—A direction. In other words, the drop DR moves toward the groove G1 as indicated by an arrow M14, reaching the deepest position in the groove G1.

Figure 6:
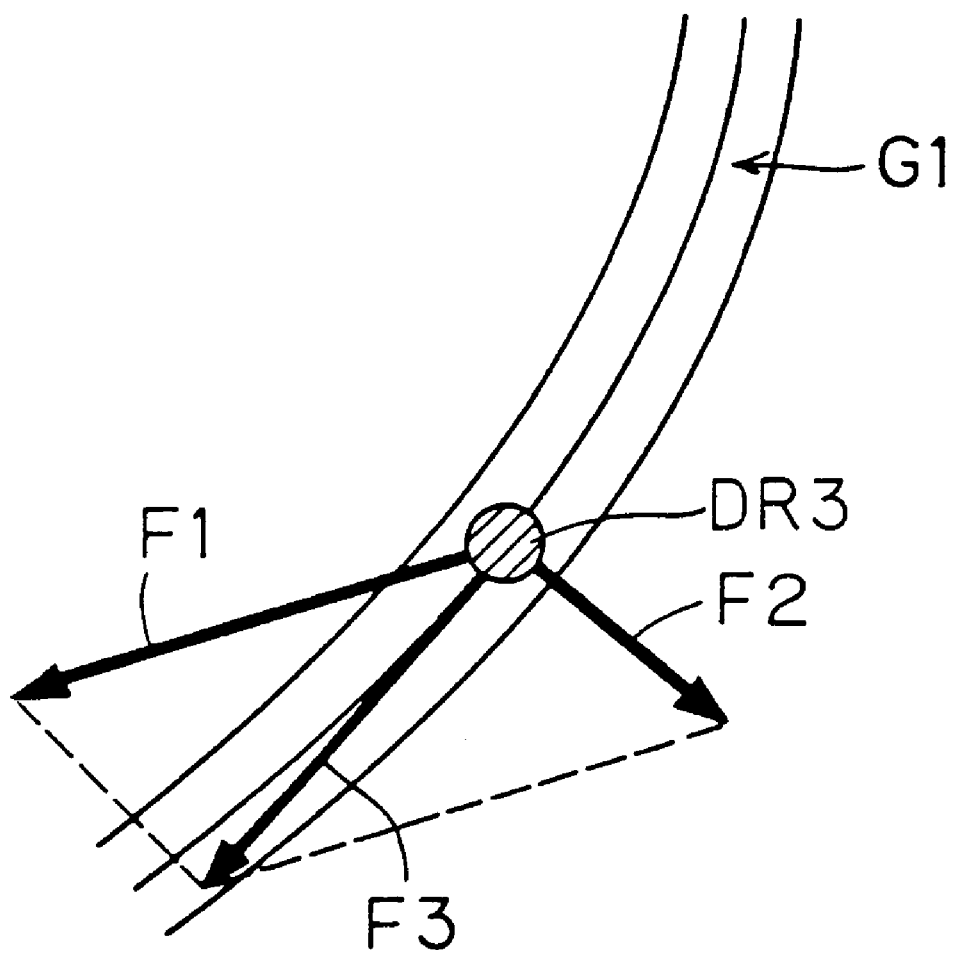
FIG. 6 is a diagram showing principles in which a drop moves.

After entering the groove G1, the drop DR is subjected to force from a wall surface of the groove G1 so that the drop DR can not move in any direction other than the direction in which the groove G1 extends. FIG. 6 shows a condition of the force which acts upon a drop DR3. The air stream exposes the drop DR3 to force F1 which bears off somewhat toward the center axis Z from the circumferential direction. At the same time, the drop DR3 is subjected to force F2 from the wall surface of the groove G1 in a direction which is perpendicular to the direction of elongation of the groove G1, and therefore, of the force from the air stream, only a component F3 which is in the direction of elongation of the groove G1 acts upon the drop DR3. Hence, once the drop DR3 enters the groove G1, the drop DR3 moves along the groove G1.

The drop DR3 entering the groove G1 moves toward an outer edge portion of the cover plate 31 as indicated by an arrow M12 along the groove G1 in FIG. 4. As time elapses, the drop DR3 is discharged outside the cover plate 31 as indicated by an arrow M13 and collected by the cup 51 (See FIG. 3).

To ensure that the drop DR moves along the groove G1 and is discharged outside the cover plate 31, the component F3, which is along the groove G1, of the force F1 to which the drop DR3 is subjected must be in the direction of the groove G1 toward outside the cover plate 31. If the grooves G1 are formed to satisfy this condition, the grooves G1 take on a vortical shape as shown in FIG. 4. Of course, the direction of an air stream which is created at the cover surface 31a of the cover plate 31 changes depending on a rotation speed of the substrate W, a distance between the substrate W and the cover plate 31, etc. FIG. 4 merely shows one example of the vortical grooves.

As described above, in the substrate processing apparatus 1, since the vortical grooves G1 are formed in the cover plate 31, the drops DR do not move in the direction of the center axis Z which is the center of rotation of the substrate W, but are discharged outside the cover plate 31 along the groove G1, away from the center axis Z. This prohibits the drops DR from falling off onto the surface of the substrate W. As a result, the quality of the substrate W is improved.

Further, while processing solution or pure water is dropped as the substrate W rotates, when gas such as nitrogen gas is not supplied from the gas supply pipe 42, no gas is supplied in the vicinity of the center of the substrate W. This intensifies an air stream which flows toward the center from around the cover plate 31, and therefore, the drops DR tend to grow big. The present invention is particularly effective to such a case.

Of course, supplying gas such as nitrogen gas from the gas supply pipe 42 is more effective in preventing the drops DR from growing big when processing solution or pure water is dropped while rotating the substrate W. Moreover, since the drops DR adhered to the cover plate 31 are dried, even more reliable prevention of dripping of the drops DR is possible.

<2. Second Preferred Embodiment>

Figure 7:
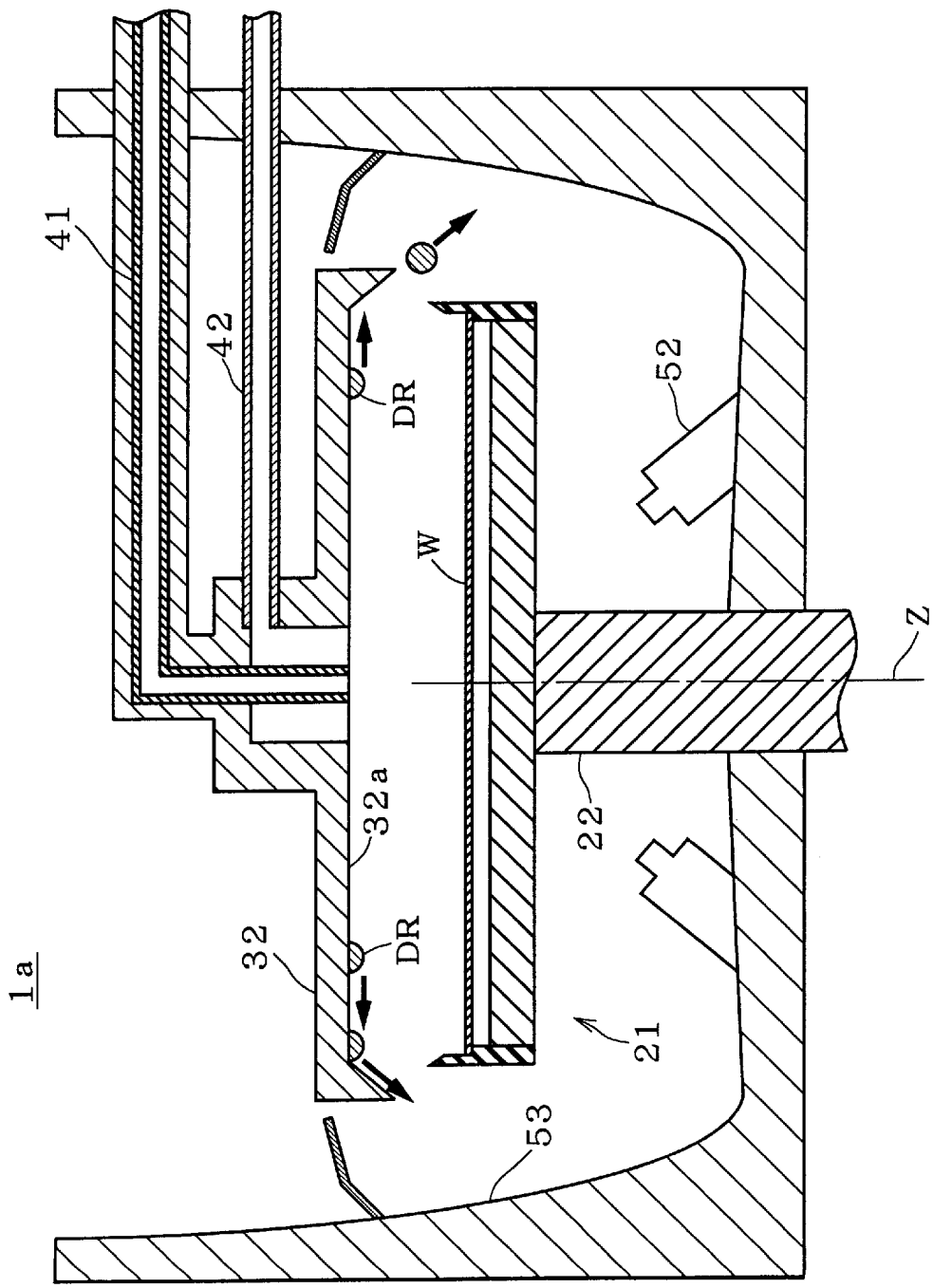
FIG. 7 is a vertical cross sectional view of a substrate processing apparatus according to a second preferred embodiment of the present invention.

FIG. 7 is a vertical cross sectional view of a substrate processing apparatus 1a according to a second preferred embodiment of the present invention. As in the first preferred embodiment, the substrate processing apparatus 1a supplies processing solution, pure water and nitrogen gas to a substrate W while rotating the substrate W to thereby process the substrate W by a predetermined treatment.

The substrate processing apparatus 1a requires that a cover plate 32 and a cup 53 are separated from each other. The cover plate 32 and the cup 53 are different in shape from those of the first preferred embodiment, but perform similar functions. However, grooves which are formed in a cover surface 32a of the cover plate 32 are different in shape from those of the first preferred embodiment. Other elements are generally the same in shape to the other elements which are used in the first preferred embodiment, and will be indicated at the same reference symbols.

Figure 8:
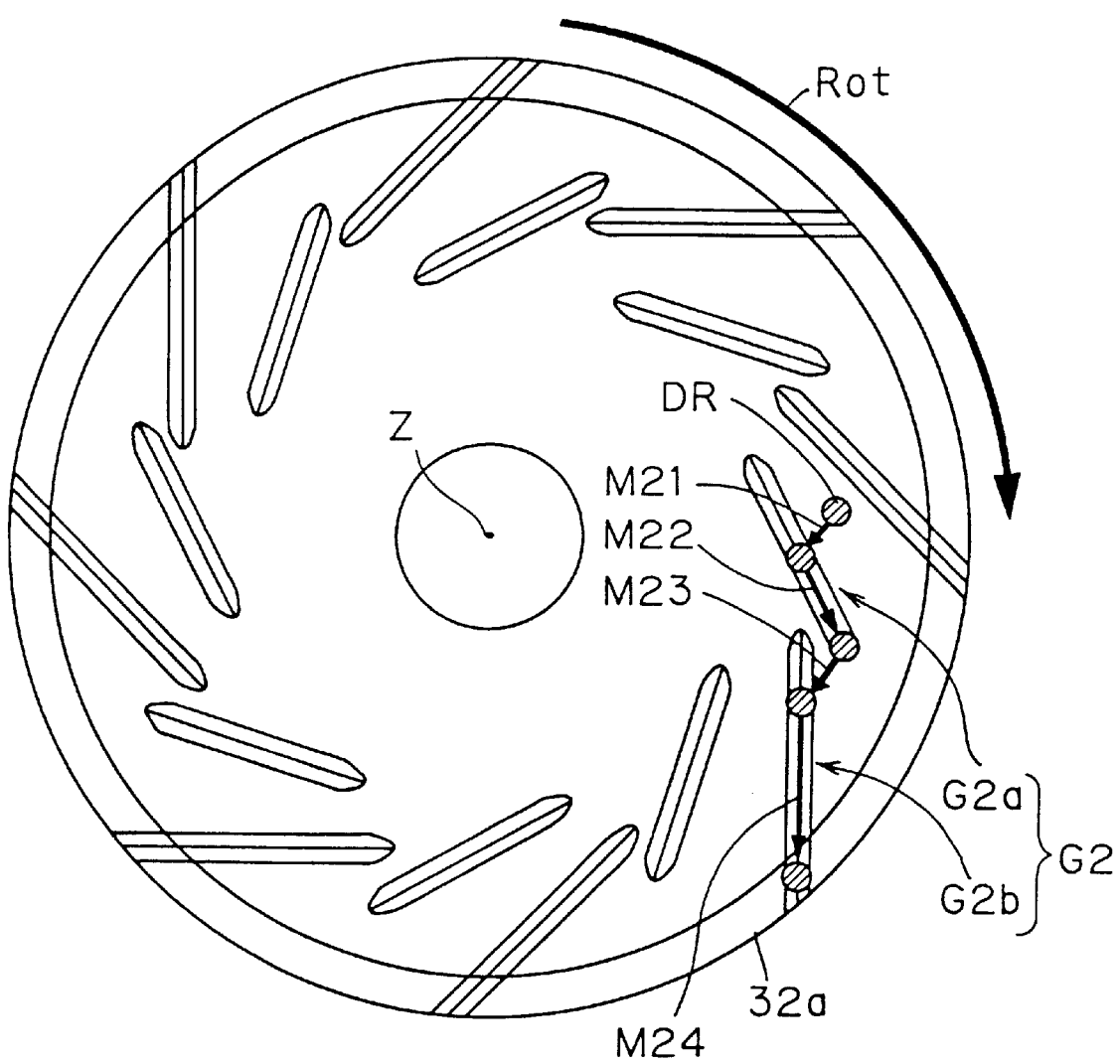
FIG. 8 is a diagram showing a cover surface of a cover plate.

FIG. 8 is a diagram of the cover surface 32a of the cover plate 32 as it is viewed from below. As shown in FIG. 8, a plurality of linear segments of grooves G2 are formed in the cover surface 32a. Each groove G2 is twisted radially from an outward direction (i.e., radius direction) about the center axis Z to a rotation direction Rot of the substrate W. Further, the grooves G2 are divided into grooves G2b each extending to an outer edge of the cover plate 32 and grooves G2a which are formed inward the grooves G2b.

Now, movement of drops DR in the substrate processing apparatus 1a will be described while referring to FIGS. 7 and 8.

First, as shown in FIG. 8, subjected to force from an air stream, a drop DR adhered to the cover surface 32a of the cover plate 32 moves in the direction of an arrow M21 which is slightly at an angle with the center axis Z, and enters the groove G2a, as in the first preferred embodiment. Following this, the drop DR moves along the groove G2a as indicated by an arrow M22. However, since the groove G2a does not extend to the outer edge of the cover plate 32, the drop DR returns to the cover surface 32a from an edge of the groove G2a.

Next, the drop DR returning to the cover surface 32a moves as indicated by an arrow M23 under the force of the air stream, entering the groove G2b this time. The drop DR then moves along the groove G2b as indicated by an arrow M24 and exits the cover plate 32.

As shown in FIG. 7, the cover surface 32a of the cover plate 32 has a broader external configuration than the substrate W, so that the drop DR exiting the cover plate 32 does not drop onto the substrate W, but drops into the cup 53 and discharged. While the second preferred embodiment does not require to form the grooves G2 in the vicinity of the center of the cover plate 32, since drops spattered off the substrate W adhere to the outer edge of the cover surface 32a, forming the grooves G2 in this manner does not create any problem.

As described above, in the substrate processing apparatus 1a, since the plurality of linear grooves G2 are formed in the cover surface 32a of the cover plate 32, it is possible to discharge the drops DR without allowing the drops DR to fall off onto the surface of the substrate W. This improves the quality of the substrate W.

Further, since the grooves G2 of the second preferred embodiment have a linear shape unlike in the first preferred embodiment which requires to form the vortical grooves G1, it is easy to form the groove G2.

<3. Third Preferred Embodiment>

Figure 9:
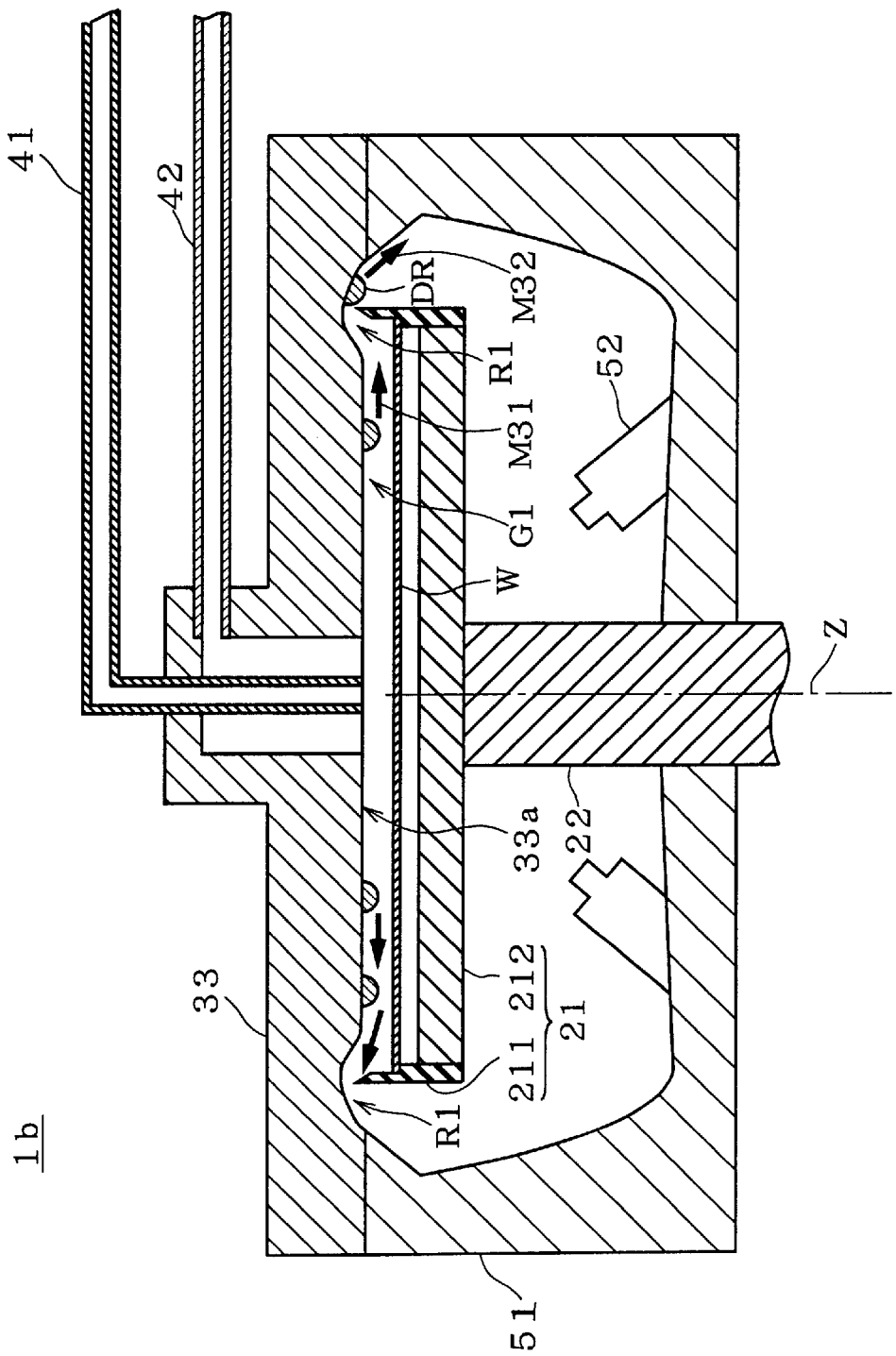
FIG. 9 is a vertical cross sectional view of a substrate processing apparatus according to a third preferred embodiment of the present invention.

FIG. 9 is a vertical cross sectional view of a substrate processing apparatus 1b according to a third preferred embodiment of the present invention. The substrate processing apparatus 1b is different from the apparatus of the first preferred embodiment only in that a chuck recess R1, which is an approximately annular smooth recess portion and defines a clearance for accepting pins 211, is formed in a cover surface 33a of a cover plate 33. In short, although vortical grooves G1 are formed in the cover surface 33a of the cover plate 33, the substrate processing apparatus 1b is otherwise similar to the apparatus of the first preferred embodiment so that similar elements will be indicated at the same reference symbols. The vortical grooves G1 are formed in the chuck recess R1 as well, as grooves which contiguously extend from the vicinity of the center of the cover plate 33 to the boundary between the cover plate 33 and the cup 51.

In the substrate processing apparatus 1b, a drop DR moves along the groove G1 as indicated by an arrow M31 toward the outer edge of the cover plate 33 as in the first preferred embodiment, but arrives at the chuck recess R1. However, since the chuck recess R1 has a smoothly recessed configuration and the grooves G1 extend to the boundary between the cover plate 33 and the cup 51 across the chuck recess R1, the drop DR crosses the chuck recess R1 and exits into the cup 51 as indicated by an arrow M32 without dropping off. The grooves G1 may not be formed across the chuck recess R1 depending on the direction of an air stream in the vicinity of the chuck recess R1, in which case, it is not necessary to form the grooves G1 up to the boundary between the cover plate 33 and the cup 51.

Thus, since the chuck recess R1 which is an approximately ring-shaped smooth recess portion, is formed in the cover surface 33a of the cover plate 33, it is possible in the substrate processing apparatus 1b to reduce the gap between the substrate W and the cover surface 33a without interfering the cover surface 33a and the chuck pin 211. This reduces a space above the substrate W, and hence, allows a decreased number of particles and the like which intrude above the substrate W. As a result, it is possible to discharge the drops DR while preventing intrusion of particles and the like, and to further improve the quality of the substrate W.

<4. Fourth Preferred Embodiment>

Figure 10:
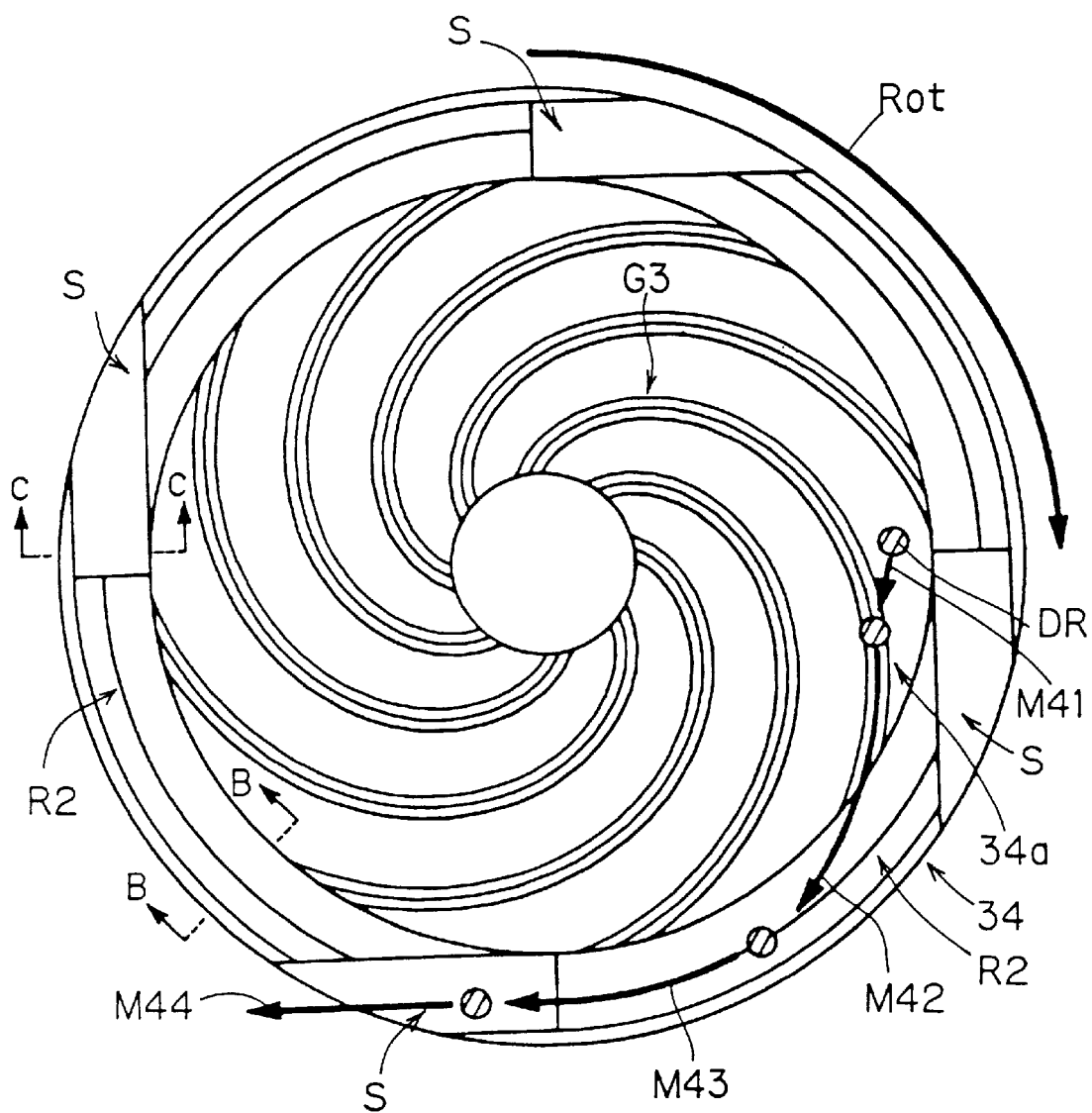
FIG. 10 is a diagram showing a cover surface of a cover plate.

FIG. 10 is a diagram of a cover surface 34a of a cover plate 34 of a substrate processing apparatus according to a fourth preferred embodiment of the present invention, as it is viewed from below. Other elements are similar to those of the first preferred embodiment.

Figure 11:
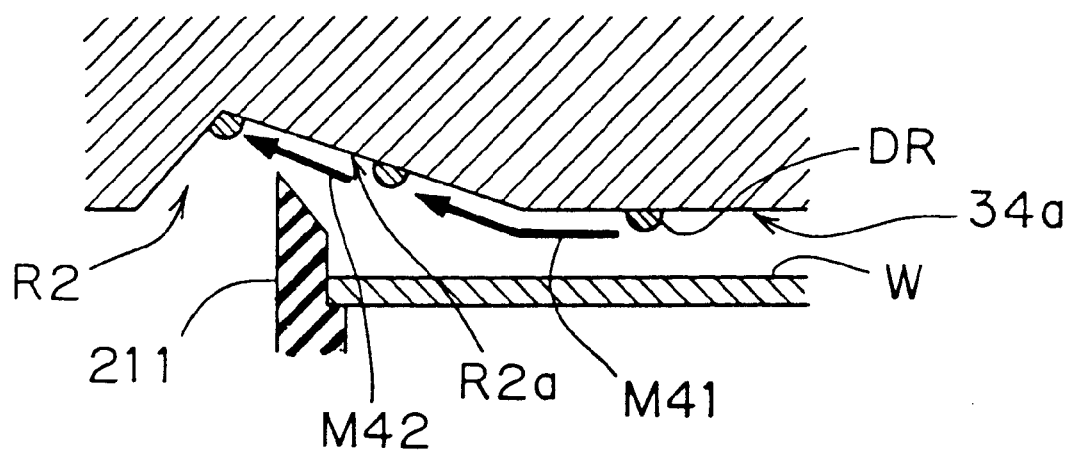
FIG. 11 is a cross sectional view of a chuck recess.
Figure 12:
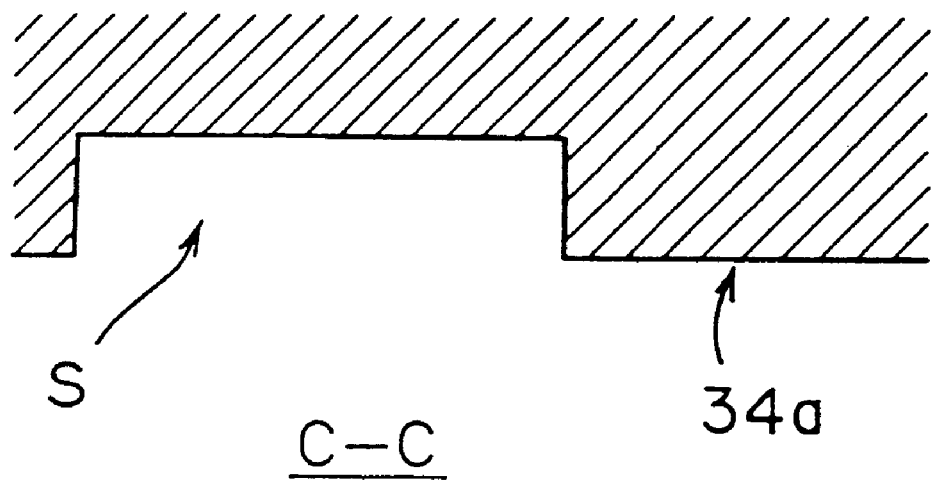
FIG. 12 is a cross sectional view of a gutter.

As in the first preferred embodiment, vortical grooves G3 are formed in the cover plate 34 of the substrate processing apparatus. Further, a chuck recess R2 is formed as an approximately ring-shaped region at outer edge of the cover surface 34a, and the grooves G3 are formed in the chuck recess R2 as well. FIG. 11 is a cross sectional view showing the chuck recess R2, as it is viewed from a B—B direction, to thereby show a positional relationship between the chuck recess R2 and the chuck pin 211. In addition, as shown in FIG. 10, gutters S are formed at four positions in the cover surface 34a. FIG. 12 is a cross sectional view of one of the gutters S, as it is viewed from a C—C direction. As shown in FIG. 12, the gutters S are grooves which are rectangular in cross section. Further, as shown in FIG. 10, the gutters S extend straight toward an edge of the cover plate 34 from the chuck recess R2, inclined to the rotation direction Rot of the substrate W. The gutters S and the chuck recess R2 are approximately the same in depth.

By disposing the cover plate 34 which comprises the cover surface 34a having such a configuration, a drop DR is discharged in the following manner in this substrate processing apparatus.

First, the drop DR adhering to the cover surface 34a of the cover plate 34 moves toward the groove G3 as indicated by an arrow M41 in FIG. 10, under force of an air stream which is created as the substrate W rotates. The drop entering the groove G3 moves along the groove G3 as indicated by an arrow M42 as in the first preferred embodiment, reaching the deepest position in the chuck recess R2. FIG. 11 as well shows this. In addition, a slanted surface R2a of the chuck recess R2 on the center of rotation side of the substrate W has sufficiently moderate inclination as shown in FIG. 11, so that the drop DR does not fall off from the cover surface 34a when the drop DR enters the chuck recess R2. When the depth of the chuck recess R2 is larger than the depth of the grooves G3, the grooves G3 may be formed up to the slanted surface R2a.

The drop DR entering the chuck recess R2 moves along the chuck recess R2 as indicated by an arrow M43 in FIG. 10 under similar principles to those where the drop DR moves in the groove G3, arriving at the gutter S. The drop DR further moves along the gutter S and exits the cover plate 34 as indicated by an arrow M44.

As described above, all the drops DR moving along each groove G3 are once gathered into the chuck recess R2 before being discharged from the gutters S. Thus, the drops DR are so combined with other drops into big drops or streams as to be smoothly discharged from the gutters S. This ensures discharge of the drops DR and improves the quality of the substrate W.

In addition, it is possible to reduce the space above the substrate W, prevent intrusion of particles and the like, and further improve the quality of the substrate W since the chuck recess R2 is disposed in this substrate processing apparatus as in the third preferred embodiment.

<5. Modification>

While the preferred embodiments of the invention have been described above, the present invention is not limited to the preferred embodiments above.

For example, the number of the grooves which are formed in the cover surface which is the bottom surface of the cover plate is not limited to those described in relation to the preferred embodiments above. The number may be larger or smaller than those described in relation to the preferred embodiments above.

In addition, although the second preferred embodiment requires to form the two types of grooves, i.e., the grooves G2a and the grooves G2b as the grooves G2, since the drops DR do not adhere to the center and a surrounding portion of the cover surface 32a almost at all, only the grooves G2b may be formed. Alternatively, the grooves G2a and the grooves G2b may be formed contiguous to each other as continuous bent grooves.

Figure 13A:
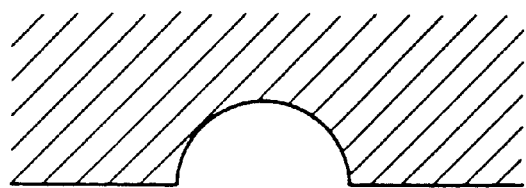
FIGS. 13A to 13D are cross sectional view of various uneven patterns.
Figure 13B:
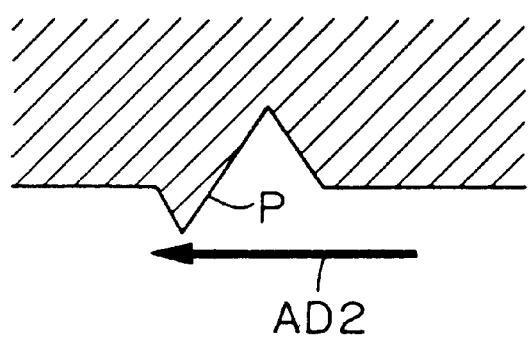
Figure 13C:
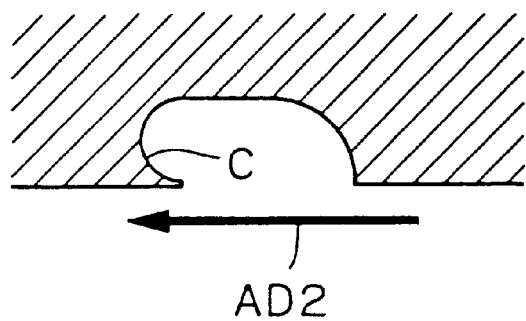
Figure 13D:
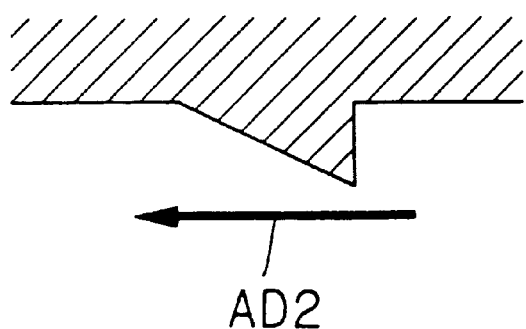

Further, although the V-shaped grooves in the preferred embodiments above, the grooves may be U-shaped as shown in FIG. 13A instead of V-shaped. Alternatively, a projection P may be formed at one of the edges of each groove (i.e., the groove of the center of rotation side of the substrate W) as shown in FIG. 13B, or one of the side surfaces of each groove (i.e., the side surface of the center of rotation side of the substrate W) may be formed as a surface C which has an extremely recessed shape as shown in FIG. 13C. Further, alternatively, each groove may have a convex shape in cross section like a saw tooth as shown in FIG. 13D. These uneven patterns serve as obstacles for drops when the drops move under force of an air stream which is created as a substrate rotates. To the extent that the uneven patterns are capable of guiding and containing drops until the drops are discharged outside the cover plate, the uneven patterns may be formed in any shape.

While the invention has been described in detail, the foregoing description is in all aspects illustrative and not restrictive. It is understood that numerous other modifications and variations can be devised without departing from the scope of the invention.

I claim:

1. An apparatus for processing a substrate, comprising:
   support means for supporting said substrate horizontally;
   rotation means for rotating said support means around a vertical center axis of said substrate;
   cover means for covering an upper surface of said substrate across a gap, comprising:
   a cover surface opposite to said upper surface of said substrate, and
   a radial uneven pattern provided on said cover surface and twisted in a direction of rotation of said substrate; and
   liquid supply means for supplying processing liquid on said upper surface of said substrate.

2. The apparatus of claim 1, wherein
   said radial uneven pattern is a vortical pattern.

3. The apparatus of claim 1, wherein
   said radial uneven pattern is a set of linear segments.

4. The apparatus of claim 1, wherein
   said radial uneven pattern is composed of grooves.

5. The apparatus of claim 4, wherein
   each of said grooves has a V-shaped cross section.

6. The apparatus of claim 1, wherein
   said cover surface is broader than said upper surface of said substrate.

7. The apparatus of claim 1, further comprising
   a cup enclosing said substrate,
   wherein an inner surface of said cup is continuously connected to said cover surface.

8. The apparatus of claim 1, wherein
   said support means comprises
      pins for chucking said substrate, and
      said cover means further comprises
         an annular recess defining a clearance for accepting said pins.

9. The apparatus of claim 8, wherein
said radial uneven pattern extends to said annular recess.

10. The apparatus of claim 9, wherein
said cover means further comprises
   a gutter extending from said annular recess toward an edge of said cover surface and inclined to said direction of rotation of said substrate.

11. The apparatus of claim 1, wherein
said liquid is scattered on said upper surface of said substrate to form a drop of said liquid on said cover surface,
rotation of said substrate generates a gas flow on said cover surface, and
said gas flow pushes said drop of said liquid along said radial uneven pattern toward an edge of said cover surface.

12. The apparatus of claim 1, wherein
said liquid supply means are connected to said cover means.

13. The apparatus of claim 12, further comprising
means connected to said cover means and defining a path for supplying gas to said upper surface of said substrate.

* * * * *